(12) United States Patent
Beckenbaugh et al.

(10) Patent No.: US 11,385,114 B2
(45) Date of Patent: Jul. 12, 2022

(54) FORCE DETECTING SENSOR (71) Applicant: Peratech Holdco Ltd., Richmond (GB)

(72) Inventors: William Max Beckenbaugh, Chappell Hill, TX (US); Richard McConnell, Oceanside, CA (US)

(73) Assignee: Peratech Holdco Ltd., Richmond (GB)

( * ) Notice: Subject to any disclaimer, the term of this patent is extended or adjusted under 35 U.S.C. 154(b) by 236 days.

(21) Appl. No.: 16/638,302

(22) PCT Filed: Aug. 15, 2018

(86) PCT No.: PCT/GB2018/000113
§ 371 (c)(1),
(2) Date: Feb. 11, 2020

(87) PCT Pub. No.: WO2019/034828
PCT Pub. Date: Feb. 21, 2019

(65) Prior Publication Data
US 2020/0225102 A1 Jul. 16, 2020

(30) Foreign Application Priority Data

Aug. 16, 2017 (GB) ..................................... 1713123

(51) Int. Cl.
*G01L 5/22* (2006.01)
*G01L 1/22* (2006.01)
*H03K 17/96* (2006.01)

(52) U.S. Cl.
CPC ................. *G01L 5/22* (2013.01); *G01L 1/22* (2013.01); *G01L 5/223* (2013.01); *H03K 17/9625* (2013.01)

(58) Field of Classification Search
CPC .. G01L 5/22; G01L 1/22; G01L 5/223; H03K 17/9625
See application file for complete search history.

(56) References Cited

U.S. PATENT DOCUMENTS

| | | | |
|---|---|---|---|
| 4,682,503 A | 7/1987 | Higashi et al. | |
| 5,046,972 A * | 9/1991 | Pass | H01R 13/193 439/751 |
| 5,632,854 A | 5/1997 | Mirza et al. | |
| 6,575,648 B1 * | 6/2003 | Liu | B41J 5/12 345/157 |
| 6,924,752 B2 * | 8/2005 | Gettemy | G06F 3/0338 341/34 |
| 9,524,070 B2 | 12/2016 | Hwang et al. | |
| 10,220,386 B2 * | 3/2019 | Williamson | G01N 35/08 |
| 11,179,194 B2 * | 11/2021 | Sliwa | A61B 5/318 |

(Continued)

FOREIGN PATENT DOCUMENTS

EP 1519173 A1 3/2005

*Primary Examiner* — Max H Noori
(74) *Attorney, Agent, or Firm* — Richard M. Goldberg (57) ABSTRACT

A sensor (102) for detecting input force includes a housing (103) having a cavity (201) and a contact element (105) which is enclosed in the cavity. The contact element and cavity provide a substantially flush profile along their respective surfaces (104, 106). The cavity includes a wall (301, 302, 303) having a sensing device (304) attached thereto and the contact element provides a physical contact between the contact element and the sensing device on application of a mechanical interaction to the surface of the contact element.

18 Claims, 10 Drawing Sheets

(56) References Cited

U.S. PATENT DOCUMENTS

| | | | |
|---|---|---|---|
| 2002/0180620 A1 | 12/2002 | Gettemy et al. | |
| 2012/0072150 A1* | 3/2012 | Furukawa | G01B 7/00 |
| | | | 702/65 |
| 2013/0152700 A1* | 6/2013 | Kamiya | G01L 1/16 |
| | | | 73/862.043 |
| 2013/0215031 A1* | 8/2013 | Peng | G06F 3/0362 |
| | | | 345/163 |
| 2013/0247690 A1 | 9/2013 | Wade | |
| 2014/0260678 A1 | 9/2014 | Jentoft et al. | |
| 2015/0169132 A1* | 6/2015 | Su | G06F 3/03547 |
| | | | 345/175 |
| 2016/0370244 A1 | 12/2016 | Seto | |
| 2017/0003187 A1 | 1/2017 | Lim et al. | |
| 2017/0329429 A1* | 11/2017 | Toyoda | G06F 3/041 |
| 2018/0197697 A1* | 7/2018 | Chen | H01H 3/125 |
| 2021/0213508 A1* | 7/2021 | Jo | B21D 11/203 |
| 2021/0361508 A1* | 11/2021 | Augustine | A61M 16/18 |

\* cited by examiner

FORCE DETECTING SENSOR

CROSS REFERENCE TO RELATED APPLICATIONS

This application claims priority from United Kingdom Patent Application number GB 17 13 123.6, filed on 16 Aug. 2017, the whole contents of which are incorporated herein by reference.

BACKGROUND OF THE INVENTION

The present invention relates to a sensor for detecting input force and the manufacture of such a sensor and a method of detecting an input force.

It is known to provide sensors for use in a wide variety of applications and industries. Sensors which provide touch capabilities in response to mechanical interactions such as pressure are often used in applications such as in electronic devices as part of a touchscreen, buttons or similar, or in respect of input devices such as joysticks for use in gaming.

When sensors are provided in commercial applications, it is often important that they present a tactile interface which appeals to a user. It can be difficult to achieve ergonomic designs without compromising on functionality. Thus, more functional sensors, in particular those which provide measurements in three dimensions, are increasingly complex in order to enable the ergonomic requirements of commercial users to be met.

BRIEF SUMMARY OF THE INVENTION

According to an aspect of the present invention, there is provided a sensor for detecting input force in accordance with the claims claim.

According to a further aspect of the present invention, there is provided a method of detecting an input force in accordance with the claims claim.

According to a still further aspect of the present invention, there is provided a method of manufacturing a sensor for detecting input force, in accordance with the claims claim.

BRIEF DESCRIPTION OF THE SEVERAL VIEWS OF THE DRAWINGS

The invention will now be described by way of example only, with reference to the accompanying drawings, of which.

DETAILED DESCRIPTION OF THE INVENTION

Figure 1:
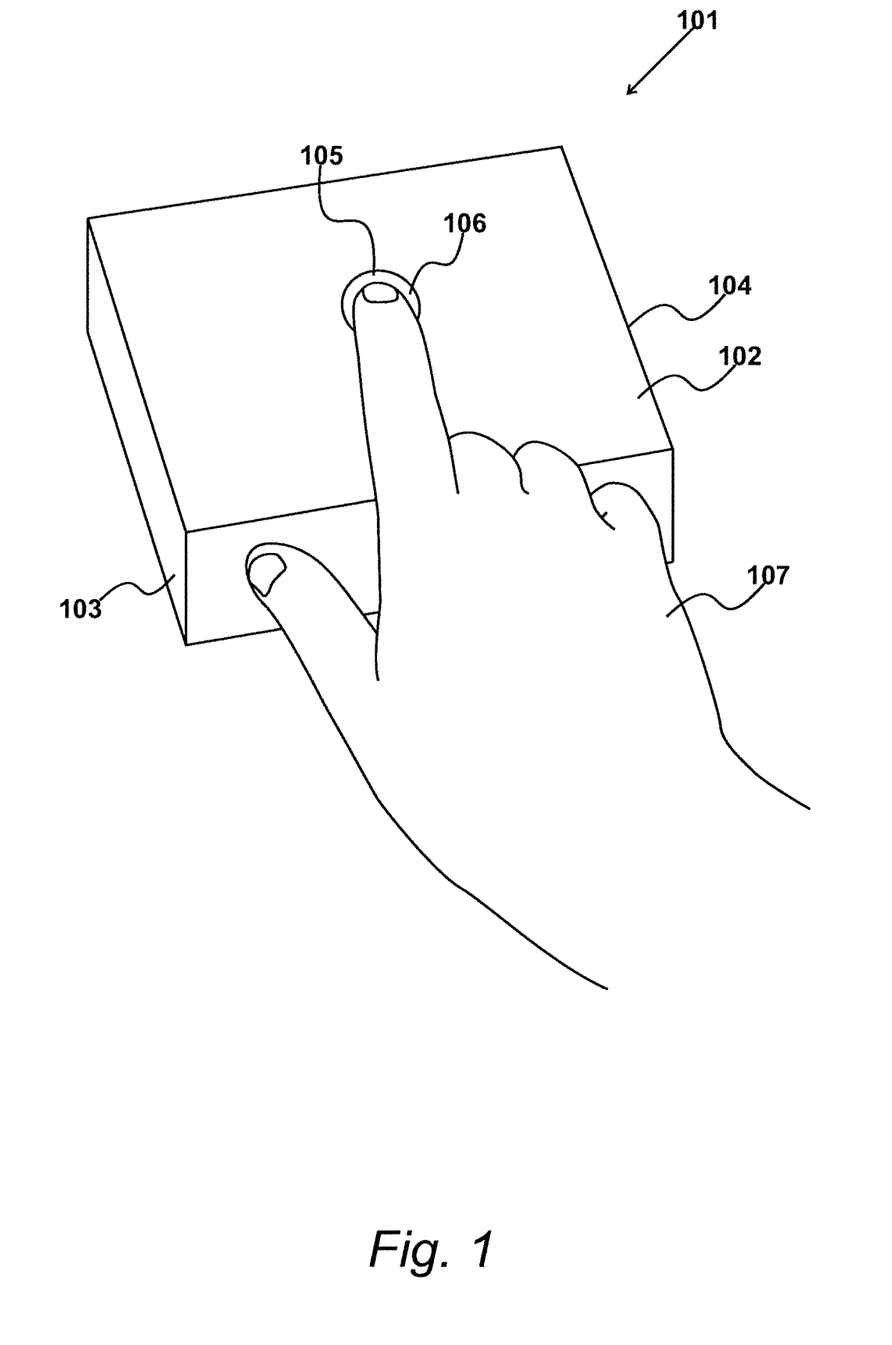
FIG. 1 shows a sensor capable of detecting input force.

FIG. 1

A sensor capable of detecting input force is illustrated in FIG. 1. FIG. 1 shows an apparatus in the form of a joystick 101 which comprises a sensor for detecting input force.

Sensor 102 comprises a housing 103 which has a top surface 104 and a contact element 105 which is enclosed by a cavity in housing 103. Contact element 105 comprises an external surface 106 which is configured to receive a mechanical interaction so as to operate sensor 102. As illustrated, external surface 106 and top surface 104 provide a substantially flush profile extending from the external surface to the top surface, and will be further described with respect to FIG. 5.

In the embodiment, external surface 106 comprises a molded portion which comprises a finger-shaped profile which conforms to the finger of user 107. In the embodiment, contact element 105 comprises an elastomeric material.

As shown, in use, sensor 102 is able to detect an input force when user 107 applies a mechanical interaction by means of an application of force to external surface 106 from the finger of user 107. In the embodiment, sensor 102 is configured to detect a property of mechanical interaction, such as a force magnitude or position of force, in response to the finger press by user 107. In this way, sensor 102 is used as a joystick and provides a low-profile joystick which a user can control with minimal movements of their finger.

Figure 2:
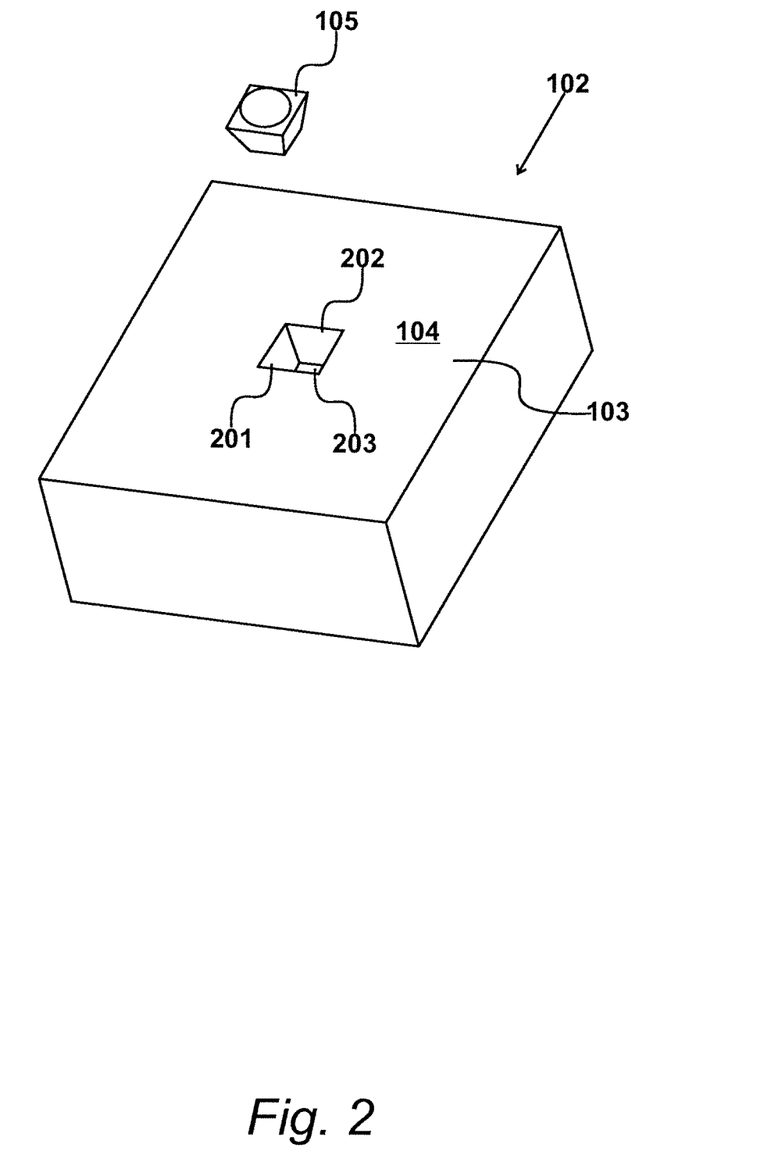
FIG. 2 shows a diagrammatic view of the sensor of FIG. 1.

FIG. 2

A diagrammatic view of sensor 102 is shown with respect to FIG. 2. Housing 103 comprises cavity 201 disposed therein and top surface 104 as previously described. Contact element 105 is shown in exploded view so as to expose cavity 201. However, in use, it is appreciated that contact element 105 is enclosed in cavity 201 as will be further described with respect to FIG. 5.

In the embodiment, cavity 201 comprises four side walls, such as side wall 202 and bottom wall 203. Contact element 105 comprises a mutually co-operating profile comprising corresponding side walls which therefore allows contact element 105 to be enclosed by cavity 201 in use.

Figure 3:
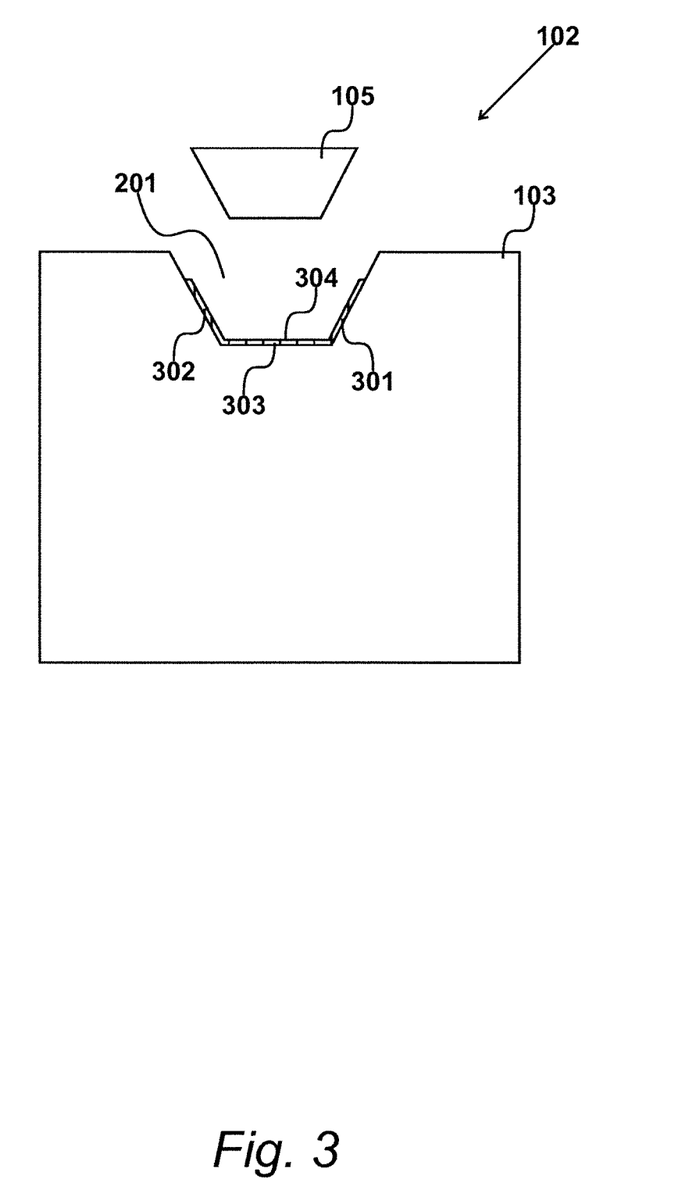
FIG. 3 shows a diagrammatic cross-sectional view of the sensor of FIGS. 1 and 2.

FIG. 3

A cross-sectional diagrammatic side view of sensor 102 is illustrated with respect to FIG. 3. Again, contact element 105 is shown in exploded view from housing 103 and cavity 201. Housing 103 defines cavity 201 as shown and a sensing device is positioned in cavity 201 to enable physical contact with contact element 105 when a mechanical interaction, such as a force, is applied.

In this embodiment, side walls 301 and 302 and bottom wall 303, define a v-shaped or u-shaped cross-sectional profile. Each of the walls 301, 302 and 303 have a sensing device 304 attached thereto. In the embodiment, sensing device 304 is aligned against the inner surface of each of the walls and attached to the inner surface.

In the embodiment, sensing device 304 is a single sensing device, although it is appreciated that, in alternative embodiments, a sensing device can be attached to each of the walls independently.

Thus, when contact element 105 is positioned within cavity 201, a contact can be made between contact element 105 and sensing device (or devices) 304.

Figure 4:
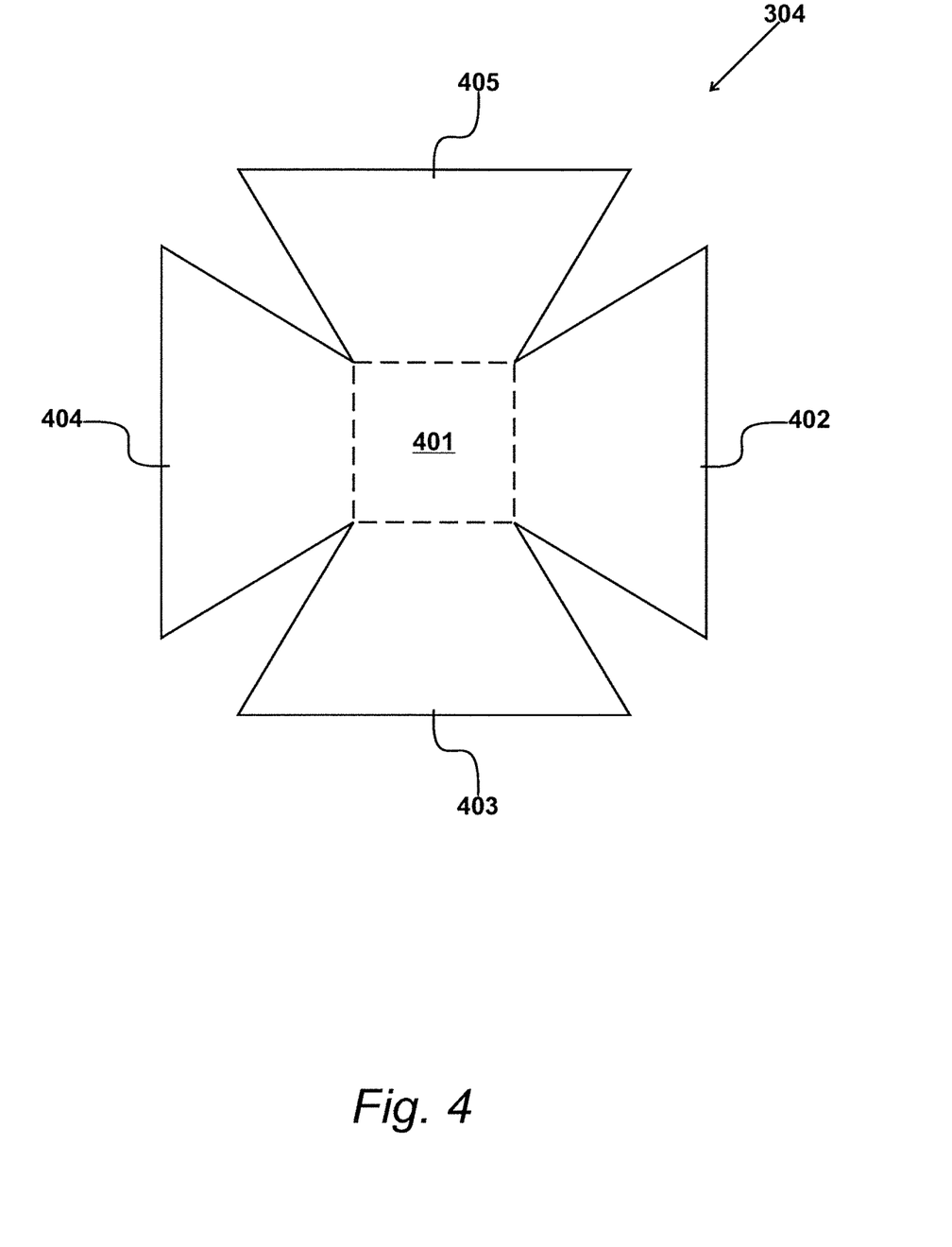
FIG. 4 shows an example sensing device for use in the sensor described previously.

FIG. 4

An example embodiment of sensing device 304 will now be described with respect to FIG. 4. FIG. 4 illustrates a plan view of a sensing device prior to its application in cavity 201 described previously. Sensing device 304 comprises a central portion 401 and four extending portions 402, 403, 404 and 405.

In the embodiment, central portion 401 is configured to be positioned in line with bottom wall 303 and extending portions 402, 403, 404 and 405 are configured to attach to side walls, such as side walls 301 and 302. Each extending portion extends from central portion 401 and includes a foldable interface which allows sensing device 304 to be folded and bent in manufacture so as to fit in cavity 201. For example, the foldable interface provides a foldable line between extending portion 402 and central portion 401 to enable extending portion 402 to align against side wall 301 in the manner shown in FIG. 3. It is appreciated that the dashed lines of FIG. 4 illustrate where foldable interfaces are present in sensing device 304.

Figure 5:
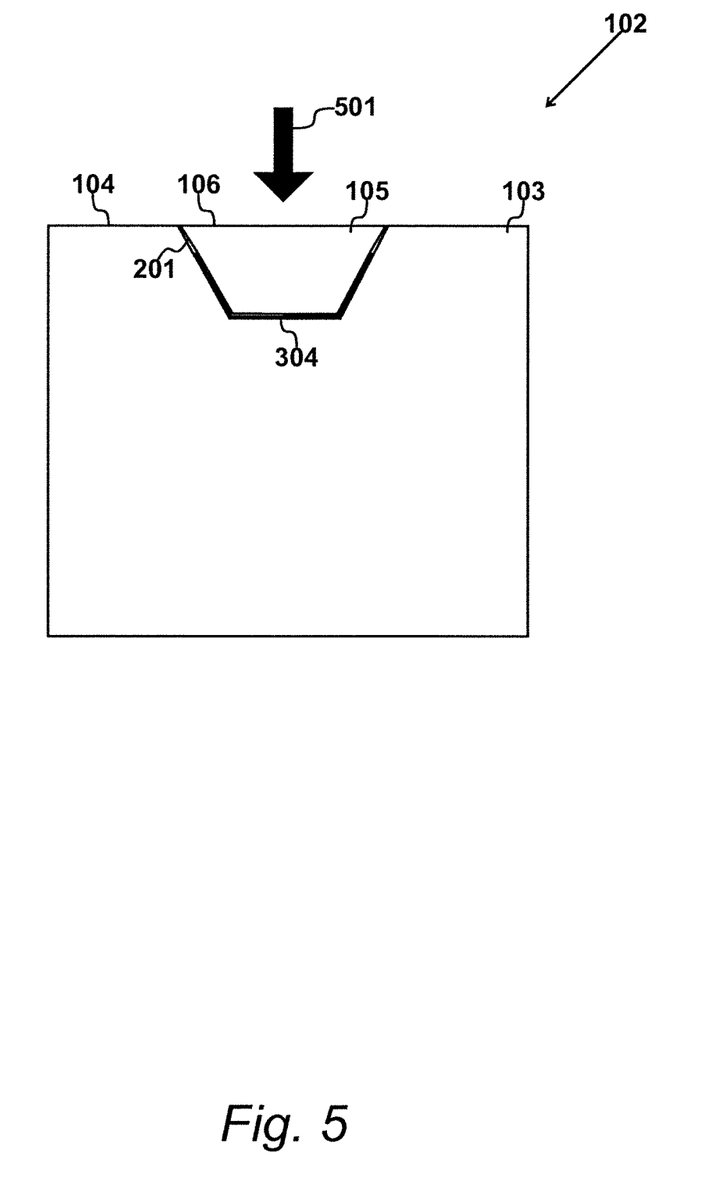
FIG. 5 shows a cross sectional side view of the sensor of FIG. 1.

FIG. 5

In manufacture of sensor 102, contact element 105 is positioned in cavity 201 of housing 103 such that contact element 105 is enclosed in cavity 201.

External surface 106 and top surface 104 of housing 103 provide a substantially flush profile which extends from external surface 106 to top surface 104.

In use, contact element 105 is configured to provide a physical contact between contact element 105 and sensing device 304 on application of a mechanical interaction in the direction of arrow 501 onto external surface 106. It is appreciated that while arrow 501 illustrates a force applied in a perpendicular direction to external surface 106, a force applied to external surface 106 in a non-perpendicular direction is still able to provide the physical contact between contract element 105 and sensing device 304. Thus, when inactive, sensing device 304 and contact element 105 are in a resting position whereby sensing device is not active (i.e. not providing a reading of force), and when the physical contact is made, sensing device 304 becomes active by means of the mechanical interaction applied. This will be described further in respect of FIGS. 6 and 7 which describe sensing device 304 in further detail.

Figure 6:
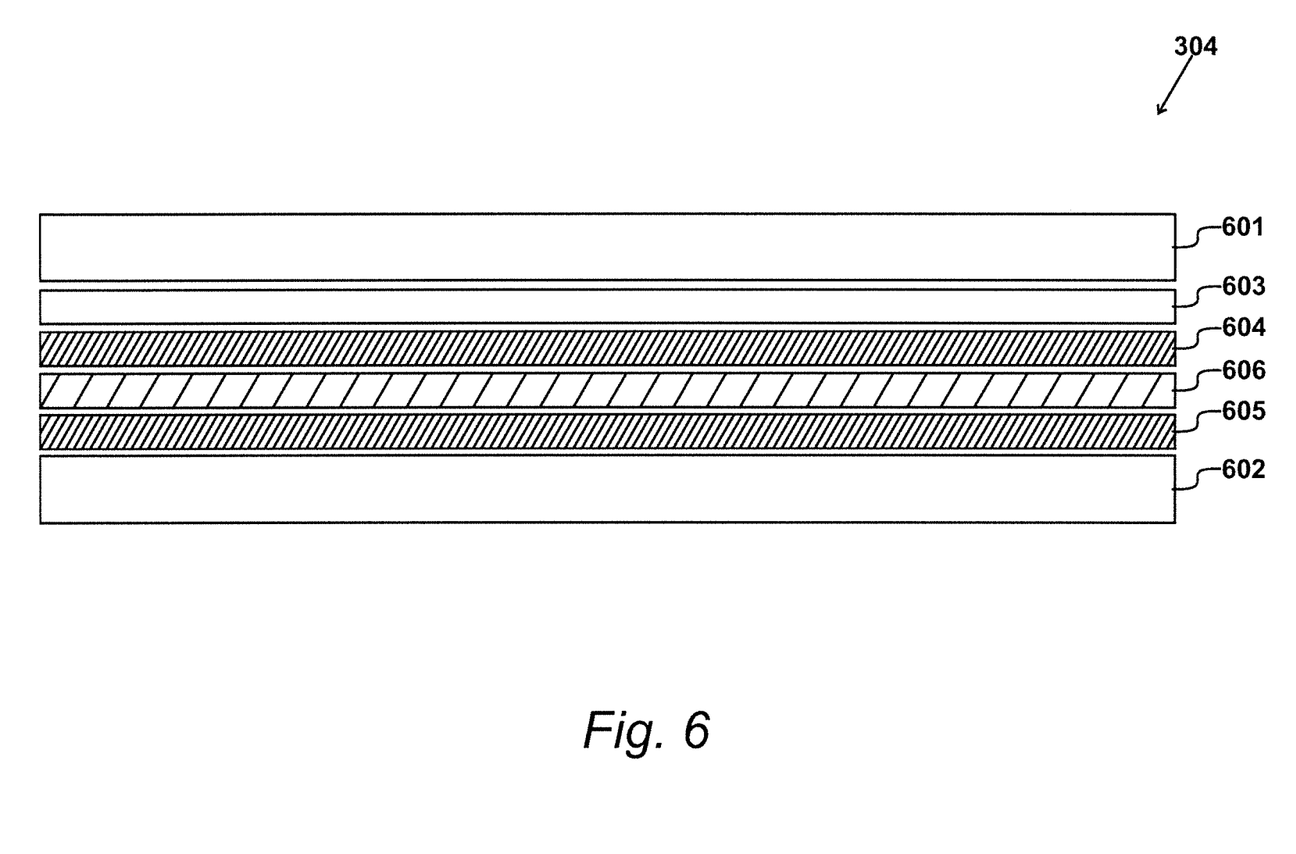
FIG. 6 shows a diagrammatic cross-sectional view of a plurality of layers which make up a sensing device.

FIG. 6

FIG. 6 shows a diagrammatic cross-sectional exploded view of a plurality of layers which make up sensing device 304 in an example embodiment.

In the example embodiment, sensing device 304 comprises a plurality of layers which combine to enable the detection of the magnitude and position of a mechanical interaction when applied to sensing device 304 by means of contact element 105. In FIG. 6, the plurality of layers are shown slightly apart in an exploded view, however, it is appreciated that these layers can be touching in the resting position but remain inactive until a mechanical interaction, such as a pressure is applied.

In the embodiment, sensing device 304 comprises substrates 601 and 602. Substrates 601 and 602 may comprise a PET (Polyethylene terephthalate) substrate although it is appreciated that other substrates may be suitable. Sensing device 304 further includes a conductive layer 603 which comprises silver and two further conductive layers 604 and 605 which comprise a printed carbon material. A further central layer 606 comprising a pressure sensitive variably resistive material is sandwiched between the two carbon layers 604 and 605. In the embodiment, the pressure sensitive variably resistive material comprises a quantum tunneling composite material.

This particular arrangement provides a single point pressure sensor which, on application of force to one of the outer substrates, experiences a reduction in electrical resistance by means of the pressure sensitive variably resistive material thereby providing a means for detecting the position and magnitude of the applied mechanical interaction. Single point pressure sensors of this type are available from the applicant, Peratech Holdco Limited, Brompton-on-Swale, United Kingdom. In an embodiment, the sensing device is able to detect magnitude and position in three dimensional Cartesian axes, such that the force itself (in the z direction) can be determined, along with the x, y position of the applied force.

Figure 7:
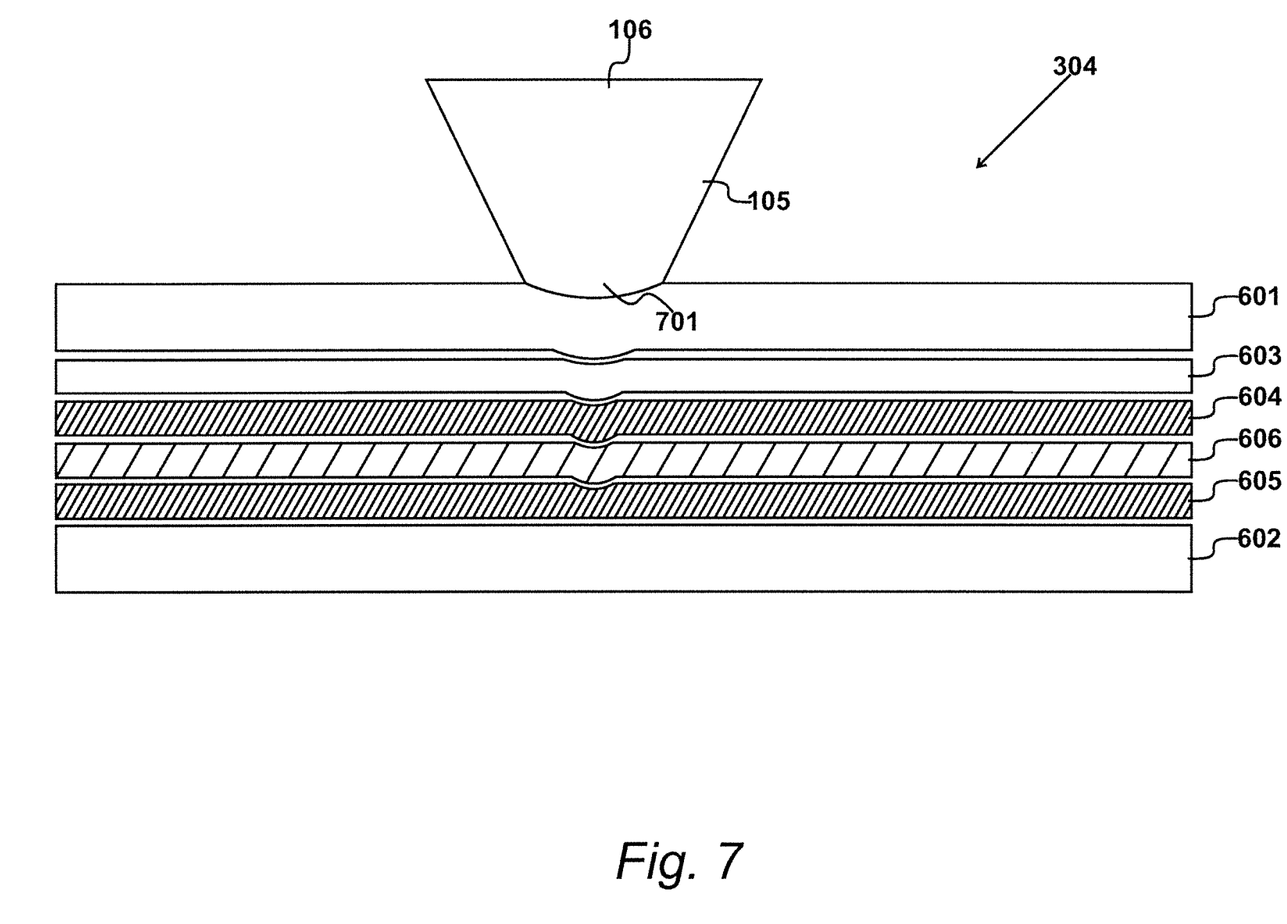
FIG. 7 shows the plurality of layers of FIG. 6 in response to a mechanical interaction.

FIG. 7

The diagrammatic view of FIG. 6 is shown in FIG. 7 and illustrates the response to a mechanical interaction by means of contact element 105. When a mechanical interaction is applied to the external surface 106 of contact element 105, physical contact is made along a bottom contact surface 701 of contact element 105. It is appreciated that, in the example previously described with respect to FIG. 5, such physical contact can be made with side contact surfaces of contact element 105 and the sensing device attached to the corresponding side walls of cavity 201.

When this physical contact is made, each layer of sensing device 304 is compressed as shown to provide a conductive path through the layers of variable electrical resistance. Thus, a magnitude of force and position of force can be determined by utilizing appropriate electrical circuitry in a manner known in the art.

Figure 8:
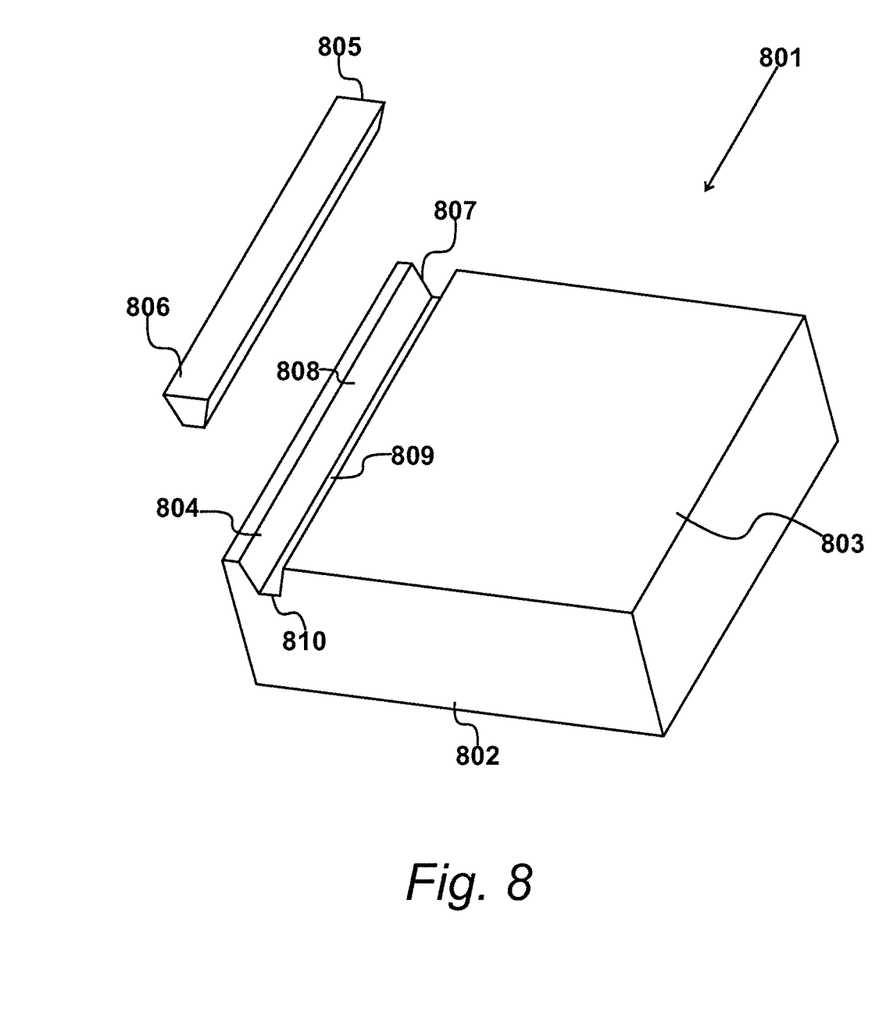
FIG. 8 shows an alternative embodiment of a sensor for detecting input force.

FIG. 8

An alternative embodiment of a sensor for detecting input force in accordance with the present invention will now be described with respect to FIG. 8. Sensor 801 is shown in diagrammatic exploded form for illustrative purposes.

Sensor 801 comprises a housing 802 having a top surface 803 and a cavity 804 disposed therein. In a similar manner to sensor 102 as previously described, sensor 801 further comprises a contact element 805 which comprises an external surface 806 and which, in use is enclosed by cavity 804. When enclosed in cavity 804, external surface 806 and top surface 803 provide a substantially flush profile which extends from the external surface 806 to the top surface 803.

In this embodiment, cavity 804 comprises an elongate channel 807 which has two longitudinal side walls 808 and 809 and a bottom wall 810, and each of these walls are provided with a sensing device, which may be substantially similar to that as previously described with respect to FIGS. 6 and 7. Contact element 805 comprises a mutually co-operating profile to cavity 804 and, in this embodiment, is therefore also elongated. In the embodiment, the cross-sectional profile of the contact element comprises a v-shaped or u-shaped profile and cavity 804 therefore provides a corresponding inverted v-shaped or u-shaped cross-sectional profile.

In use, contact element 805 again provides physical contact between contact element 805 and the sensing device on application of a mechanical interaction to the external surface 806.

Thus, it is appreciated that sensor 801 functions in a substantially similar manner to sensor 102, the difference being that the cavity is elongated and the sensing devices and contact element may also be elongated to correspond with this amendment.

Figure 9:
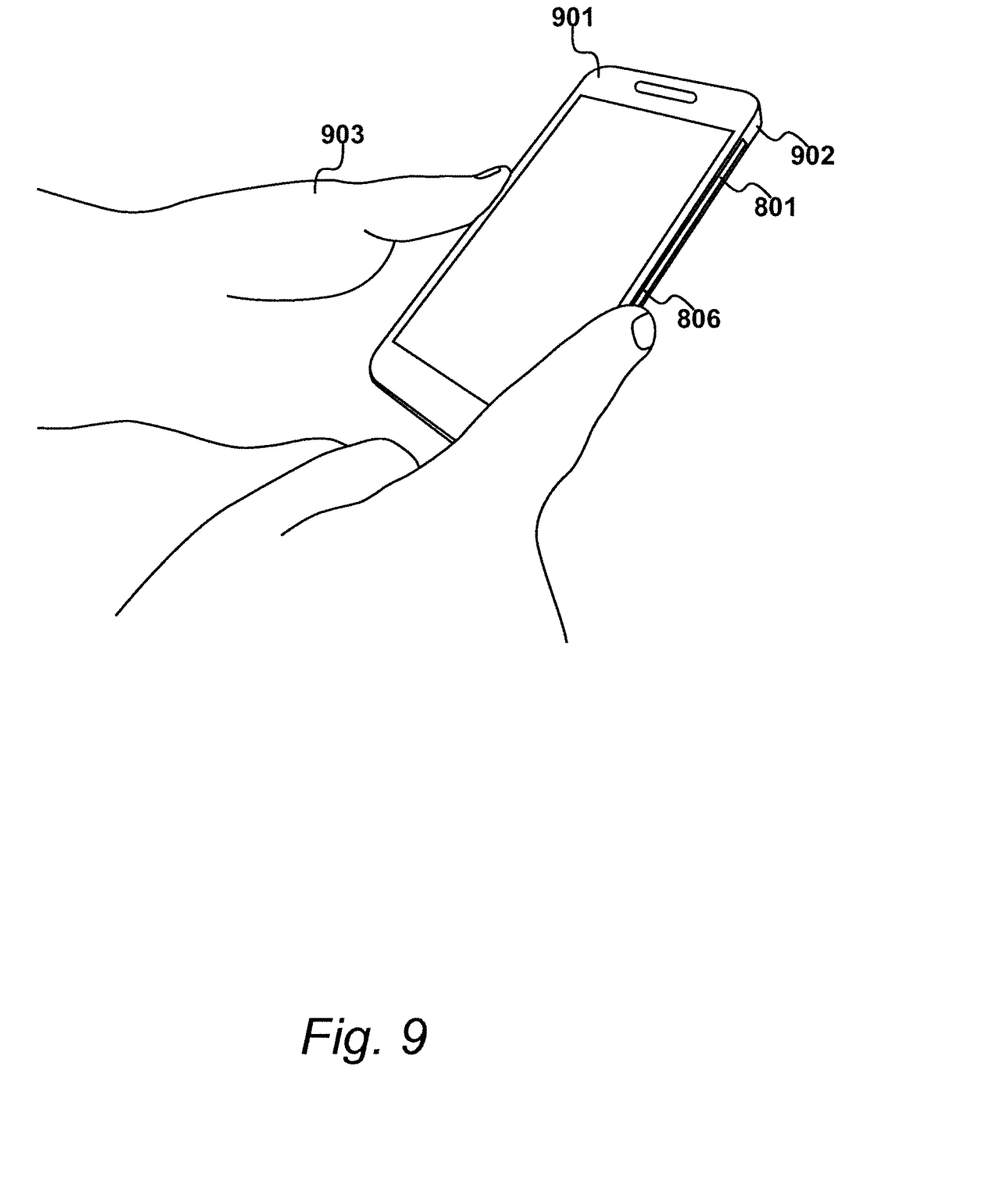
FIG. 9 shows the sensor of FIG. 8 being utilized in an electronic device.

FIG. 9

Sensor 801 can be utilized in an electronic device in the manner of FIG. 9. In the embodiment, sensor 801 forms part of an electronic device 901 which, in this illustrated example, is a mobile telephone.

Sensor 801 extends along an edge 902 of a telephone 901 and provides a user with an input device to control aspects of the mobile telephone 901. As sensor 801 provides a substantially flush profile along edge 902, it is capable of being incorporated into an electronic device without substantially affecting the design, and thus, in use, a user 903 can utilize sensor 801 as an ergonomic input device.

In this embodiment, the input force provided by user 903 is configured to be applied as a sliding force along external surface 806. The sensing devices are therefore configured to detect this mechanical interaction and provide corresponding outputs to electronic device 901. For example, a sliding force could be used to control volume output from the telephone, or, in the case of a video or other media playing on the device, advance the video by fast-forwarding or re-winding. In an alternative embodiment, sensor 801 is configured to provide a toggle function along the external surface, such that different functions can be selected or switched on or off by providing a force in an upwards or downwards manner.

It is appreciated that, while the current example describes the electronic device as a mobile telephone, any other suitable electronic device can utilize a sensor in accordance with the present invention. For example, other suitable electronic devices could be a hand-held computer, laptop, tablet, music and/or video players or other non-portable electronic devices requiring a user interface.

Figure 10:
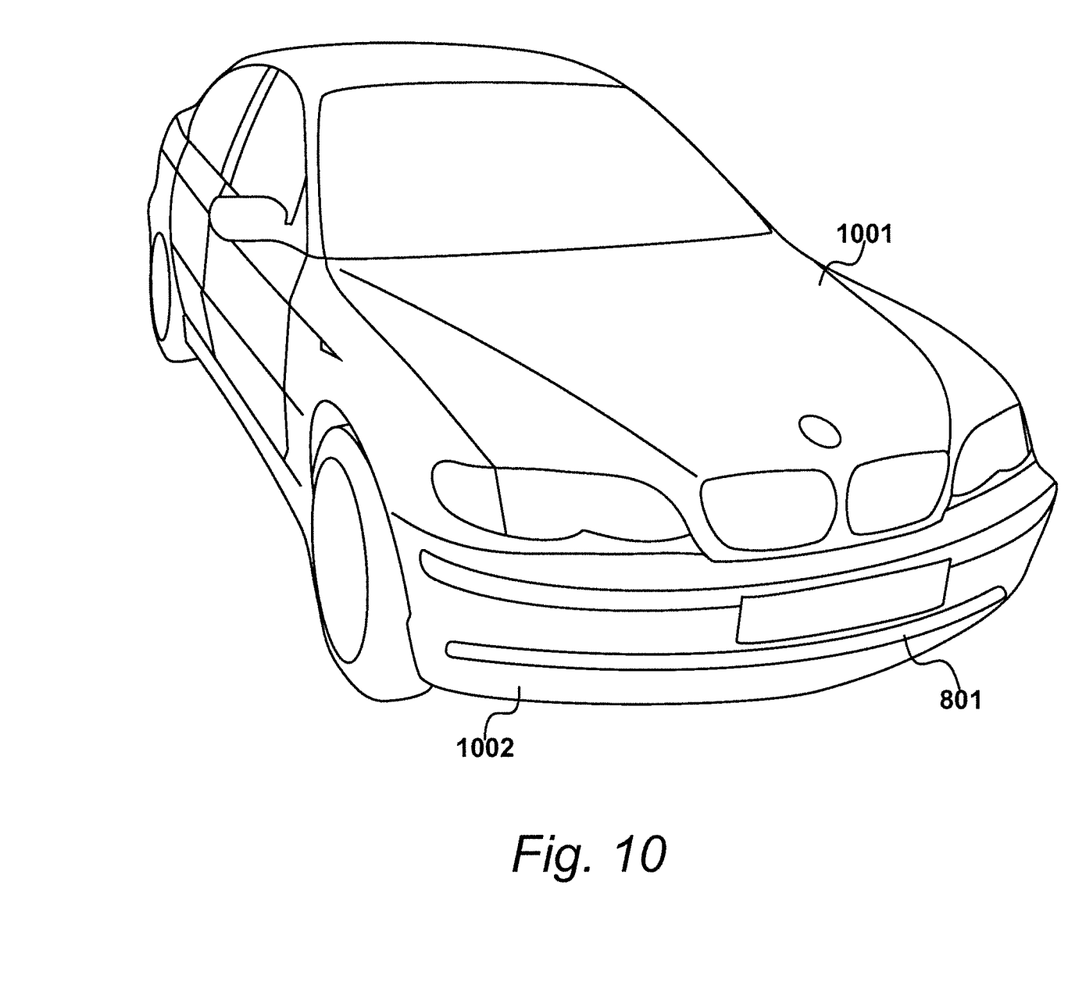
FIG. 10 shows a vehicle incorporating a sensor in the vehicle's bumper.

FIG. 10

A further example embodiment utilizing sensor 801 of FIG. 8 is shown in FIG. 10. FIG. 10 shows a vehicle 1001 in the form of a car incorporating sensor 801 in the vehicle's bumper 1002.

In this embodiment, sensor 801 is able to detect any external objects which come into contact with sensor 801. In this way, sensor 801 provides a protective bumper and reacts to any objects which may impact vehicle 1001.

It is appreciated that sensor 801 may be used in alternative applications in which the detection of external objects to provide a protective bumper is also required. For example, robotic devices may include a plurality of sensors substantially similar to sensor 801 and/or sensor 102 on the exterior of the robotic device. This would then be used as a bump detector to avoid such a robotic device from receiving damage from any impact.

The invention claimed is:

1. A sensor for detecting input force, comprising:
   a housing defining a cavity therein and a top surface; and
   a contact element enclosed within said cavity, said contact element comprising an external surface;
   said cavity comprising at least one wall having an inner surface, said at least one wall having a sensing device attached thereto and aligned against said inner surface of said at least one wall;
   said contact element being configured to provide physical contact between said contact element and said sensing device on application of a mechanical interaction to said external surface; wherein
   said external surface and said top surface provides a substantially flush profile extending from said external surface to said top surface; and
   said sensing device comprises a pressure sensitive layer of variably resistive material sandwiched between a first conductive layer and a second conductive layer, said sensing device being configured to detect a magnitude of force and position of the mechanical interaction when applied.

2. A sensor according to claim 1, wherein said sensing device is configured to detect magnitude and position in three dimensional Cartesian axes.

3. A sensor according to claim 1, wherein said sensing device is a single point pressure sensor.

4. A sensor according to claim 3, wherein said single point pressure sensor comprises a quantum tunneling composite material.

5. A sensor according to claim 1, wherein said cavity comprises four side walls and a bottom wall, each said wall having one said sensing device attached thereto.

6. A sensor according to claim 1, wherein said cavity comprises an elongate channel having two longitudinal side walls and a bottom wall, each said longitudinal side wall and said bottom wall comprising one said sensing device.

7. A sensor according to claim 1, wherein said contact element and said cavity each comprise mutually co-operating profiles.

8. A sensor according to claim 1, wherein said contact element comprises a v-shaped cross-sectional profile.

9. A sensor according to claim 1, wherein said contact element comprises an elastomeric material.

10. A sensor according to claim 1, wherein said external surface comprises a molded portion which comprises a finger-shaped profile.

11. A sensor according to claim 1, wherein said sensor is configured to detect an external object.

12. A method of detecting an input force, comprising the steps of:
    providing a sensor having a housing defining a cavity therein and a contact element enclosed by said cavity;
    applying a mechanical interaction to an external surface of said contact element, said external surface and a top surface of said housing providing a substantially flush profile extending from said external surface to said top surface;
    providing a physical contact between said contact element and a sensing device attached and aligned with an inner surface of a side wall of said cavity, wherein said sensing device comprises a pressure sensitive layer of variably resistive material sandwiched between a first conductive layer and a second conductive layer; and
    detecting a force magnitude and position of force along three axes of said mechanical interaction in response to said physical contact.

13. A method of detecting an input force according to claim 12, further comprising the step of: detecting an external object in contact with said sensor so as to provide a protective bumper.

14. A method of detecting an input force according to claim 12, wherein said step of applying a mechanical interaction involves providing a sliding force along said external surface.

15. A method of detecting an input force according to claim 12, wherein said step of applying a mechanical interaction involves providing a toggle function along said external surface.

16. A method of manufacturing a sensor for detecting input force, comprising the steps of:
    producing a housing having a top surface;
    providing said housing with a cavity comprising at least one wall;

aligning a sensing device against an inner surface of said at least one wall, said sensing device being configured to detect a magnitude of force and position of a mechanical interaction when the mechanical interaction is applied;

attaching said sensing device to said inner surface of said at least one wall; and positioning a contact element into said cavity such that said contact element is enclosed by said cavity and such that an external surface of said contact element and said top surface provides a substantially flush profile extending from said external surface to said top surface;

said contact element being able to provide physical contact between said contact element and said sensing device on application of a mechanical interaction to said external surface; and said sensing device comprises a pressure sensitive layer of variably resistive material sandwiched between a first conductive layer and a second conductive layer.

17. A method of manufacturing according to claim 16, wherein in said step of positioning said contact element into the cavity, said contact element is positioned so as to mutually co-operate with said cavity.

18. A method of manufacturing according to claim 17, wherein said contact element is produced to have a v-shaped cross-sectional profile.

* * * * *